May 25, 1965 R. A. GREINER 3,185,819
ASYMMETRICAL BINARY COUNTER
Filed Sept. 14, 1960
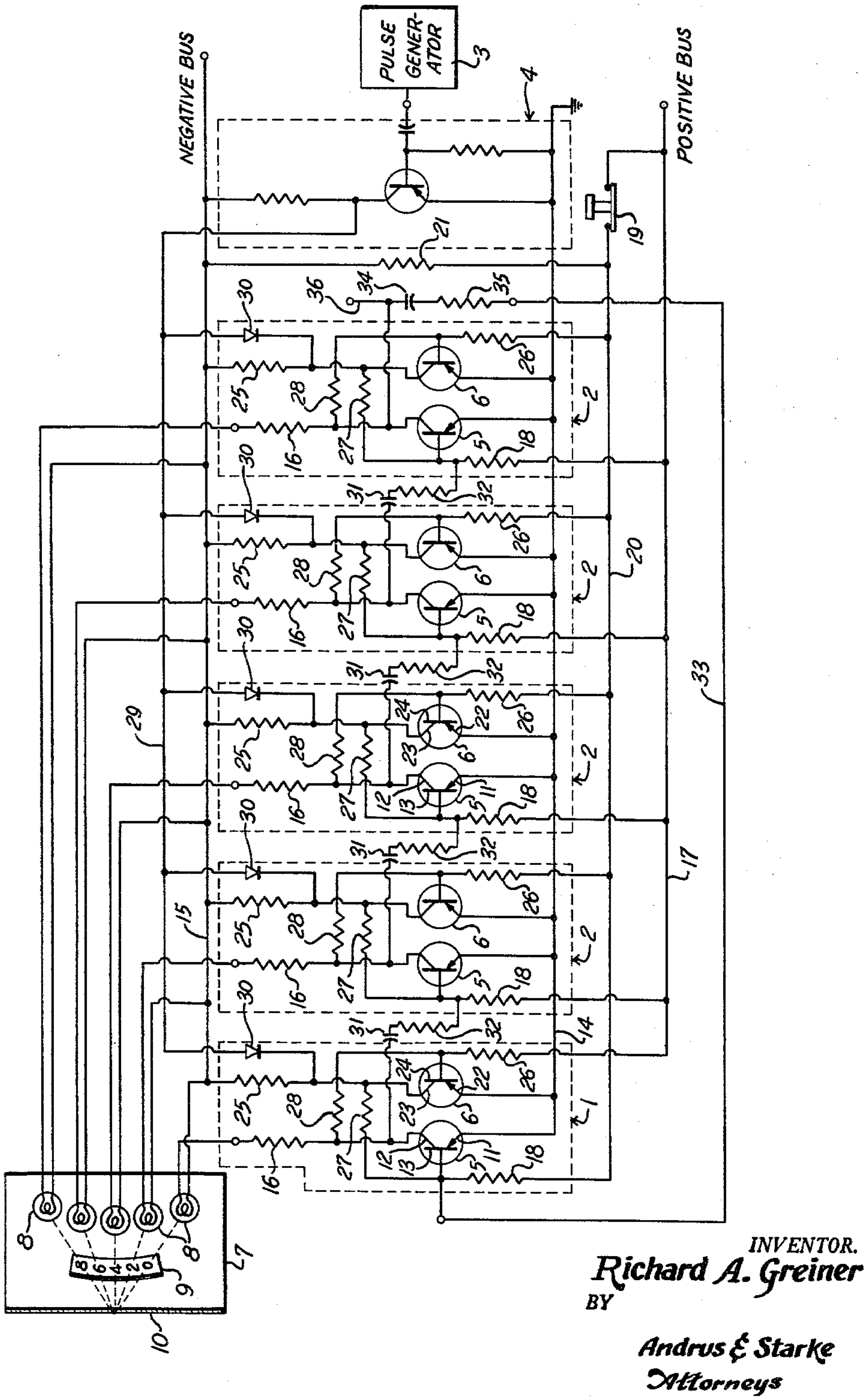
INVENTOR.
Richard A. Greiner
BY
Andrus & Starke
Attorneys 3,185,819

ASYMMETRICAL BINARY COUNTER

Richard A. Greiner, Madison, Wis., assignor to Gisholt Machine Company, Madison, Wis., a corporation of Wisconsin Filed Sept. 14, 1960, Ser. No. 55,997
12 Claims. (Cl. 235—92)

This invention relates to an asymmetrical binary counter and is particularly directed to a transistor ring using asymmetrical binaries to drive a relatively high power display such as an incandescent lamp assembly with a minimum total power consumption.

Ring counters employ a series of individual stages each including a bistable circuit including vacuum tubes or transistors interconnected to establish binary signals. The stages are interconnected to establish an output reading in a suitable logic system; for example, the conventional decimal system.

A particularly satisfactory readout is provided by an incandescent lamp display of the number or characteristics of the readout system. Individual lamps are interconnected to the individual stages of the ring counter to provide a visual record of the turning "on" of the particular stage. The lamp is a high current device and the bistable circuits normally include suitable amplifying means to provide the desired current through the projection lamp.

The conventional symmetrical binary system employs bistable circuits having similar circuit connections. The standby or "off" state of each bistable circuit is therefore a high power dissipating circuit and the total power dissipated is correspondingly large. Consequently, the display is normally connected into the bistable circuit through a separate power amplifying circuit; for example, low current relays such that only the "on" stage is dissipating substantial power.

Low current relays or the like are practically necessary in binary circuits employing transistors which are generally low power devices. Although special high power transistors are available, the cost practically eliminates use of such transistors in production binary circuits.

In accordance with the present invention, asymmetrical binary stages are employed in the ring counter. Each of the stages includes a pair of transistors, one of which constitutes a control transistor and the other of which constitutes an output transistor. An incandescent lamp or similar high current driven display operator is connected directly in the output circuit of the output transistor for establishing a reading upon conduction through the output transistor. The output transistor is biased to establish a relatively large current and consequently, when the binary stage is turned "on" a relatively large current flow is established to properly energize the display. The control transistor is biased to establish a relatively small current through the transistor and thereby maintains a low power dissipation in the corresponding output circuit of the control transistor with the binary stage in the "off" state. Therefore, only the "on" stage is dissipating substantial power and the total power consumed is minimized.

Incandescent lamps and the like which are particularly adapted for display constitute a load which varies upon energization. An incandescent lamp has an extremely low resistance when cold. The resistance increases by a factor of 5 to 10 times as the temperature increases to the operating level. The low resistance of a cold lamp results in a low gain of the binary stage which is in part controlled by the load impedance. The resulting low gain prevents proper triggering of the binary stage to establish current through the output transistor for energizing the cold lamp. In accordance with the present invention, a small impedance is added to the output circuit in series with the lamp to increase the gain of the transistor sufficiently to drive the cold lamp into conduction. A resistor is preferably employed because the cost is less than other impedances and the resistance variation of the load in the output circuit of the output transistor is substantially reduced which results in more optimum operation of the binary circuit.

The present invention thus establishes an asymmetrical transistor binary for switching a large current in one branch and a low current in the other branch and permits direct operation of high current devices or the like. The standby power of the binary is relatively small compared to the operating power and the binary is particularly adapted for high capacity counting which requires a substantial number of stages.

The drawing furnished herewith illustrates the best mode presently contemplated for carrying out the invention.

The drawing is a schematic circuit diagram of a five digit ring counter constructed in accordance with the present invention.

Referring to the drawing, the illustrated ring counter includes a first binary stage 1 coded to the decimal digit 0 and four similar stages 2 coded respectively to the decimal digits 2, 4, 6 and 8. The illustrated counter thus establishes a reading in one significant position in the decimal system, counting by increments of two. As subsequently described, additional similar counter sections can be added to increase the reading capacity of the counter.

The first binary stage 1 and the four similar binary stages 2 are connected in cascade to be sequentially energized by a series of trigger or counting pulses. A pulse source 3 is simultaneously connected to all of the binary stages 1 and 2 through a driver amplifier 4 which is adapted to establish pulses of standard height. If the incoming pulse is of sufficient magnitude, the amplifier 4 can be eliminated.

The pulse source 3 is any suitable source establishing a train of pulses suitable for operating stages 1 and 2, as subsequently described, with the number of pulses being proportional to a quantity or the like to be determined. For example, the present invention is particularly directed to establishing a direct readout in balancing equipment such as shown in the copending patent application of Werner I. Senger entitled Digital Balancing Equipment, filed on June 22, 1960, Serial No. 37,990 and assigned to a common assignee herewith. As shown and more fully described in the above patent application, a pulse source establishes a series of pulses in proportion to the amplitude of the unbalance signal. The pulse source shown therein can be applied to amplifier 4 to sequentially actuate the binary stages 1 and 2 and establish a direct reading of the amplitude of unbalance in multiples of two in the decimal system.

Driver amplifier 4 is illustrated as a common emitter connected transistor which establishes an output pulse of standard height for each incoming pulse. The output pulses are simultaneously applied to each of the binary stages 1 and 2.

The binary stages 1 and 2 each includes an output transistor 5 and a control transistor 6; shown as PNP type transistors although NPN type or other similar functioning devices can be employed with suitable bias modification and the like. Transistors 5 and 6 are connected as a bistable triggering circuit with one of the transistors normally conducting and the other transistor normally non-conducting.

In accordance with the illustrated embodiment of the present invention, a projection type readout 7 includes a series of five incandescent lamps 8, one for each of the five digits employed. Lamps 8 are connected one each in series with the output transistors 5 of the binary stages 1 and 2. A separate digit carrier mask 9 is associated with the respective lamps 8 to establish a corresponding digit upon a viewing screen 10 in accordance with the illumination of a corresponding lamp.

Lamps 8 are of any suitable construction and conventionally have an exceedingly small resistance when cold or de-energized and a substantially higher resistance when hot or energized. Thus, commercially available lamps employed have a resistance of about 40 ohms after conduction for some period and less than about 5 ohms prior to conduction.

The output transistor 5 in binary stage 1 is energized whereas the output transistors 5 of the four binary stages 2 are de-energized in the stand-by position prior to initiating a counting cycle. The digit zero therefore is set in the readout 7 and is visually indicated in the screen 10.

Referring to binary stage 1, the output transistor 5 is illustrated as a PNP type including an emitter 11, a collector 12 and a base 13. The transistor 5 is connected in a common emitter connection with the emitter 11 connected directly to a ground line 14 and forming a common connection to the output and to the input to transistor 5. The collector 12 is connected to a negative bus 15 in series circuit with a resistor 16 and the zero digit lamp 8 to complete the output circuit of transistor 5.

The resistor 16 has a resistance which is slightly larger than the resistance of a hot lamp 8. A forty-seven ohm resistor 16 has been satisfactorily employed with lamps 8 of the previously described resistance. The total change in the load for the output transistor 5 is consequently reduced to a relatively low value; generally from a factor of 5 or more to a factor of 2, and a more stable operation of the binary stage 1 results.

The base 13 of transistor 5 is connected to a positive bus 17 in series with a bias resistor 18 and a reset switch 19. The connection between the switch 19 and the resistor 18 constitutes a reset line 20 which is connected to the negative bus 15 by a reset biasing resistor 21.

With the switch 19 closed, the reset line 20 is connected directly to the positive bus 17 and consequently current from the negative bus 15 is shunted to ground through the switch 19 and the positive bus 17. The reset line 20 is then held at the voltage of the positive bus 17.

The control transistor 6 includes an emitter 22, a collector 23 and a base 24. The emitter 22 is connected directly to ground line 14 and the collector 23 is connected to the negative bus 15 in series with a load resistor 25. The base 24 of transistor 6 is connected to the positive bus 17 in series with a bias resistor 26.

A pair of resistors 27 and 28 interconnect the base of each transistor 5 and 6 to the collector of the opposite transistor. The base and emitter voltages of a conducting transistor are essentially the same because of the low internal impedance between these elements. Consequently, by controlling the bias on the base, the current level in the transistor is determined, as hereinafter described.

The base 13 of the transistor 5 is connected to the negative bus 15 through the load resistor 25 of transistor 6 in series with the resistor 27. By suitable selection of resistor 27, the connection establishes a negative voltage on the base 13 which is sufficient to maintain the transistor 5 conducting when transistor 6 is nonconducting and after a transfer pulse has been established to start or initiate current through transistor 5.

Similarly, the base 24 of transistor 6 is connected to the negative bus 15 through the load resistor 16 and the lamp 8 in the circuit of transistor 5 and the resistor 28. By suitable selection of resistor 28, the circuit maintains the transistor 6 conducting when transistor 5 is nonconducting and after a trigger pulse has momentarily driven transistor 6 into the conducting state. A resistor 28 having a substantially larger resistance than the combined resistance of lamp 8 and load resistor 16 or the coupling resistor 27 has been satisfactorily employed.

The large current through transistor 5 provides high power dissipation in lamp 8 and suitable illumination of screen 10. The small current through transistor 6 provides low power dissipation in resistor 25. Although the resistance of resistor 25 is many times greater than the combined resistance of resistor 16 and lamp 8, the current through resistor 25 is much smaller and therefore the power dissipation is much smaller. The total power dissipated in the ring counter is maintained at a low level because the four conducting control transistors 6 are held at a low level.

To initially set the counter circuit, the transistor 5 of stage 1 is biased to conduct and illuminate the associated lamp 8 of binary stage 1.

The circuit is reset to standby position by momentarily opening the reset switch 19 to break the connection between the reset biasing resistor 21 and positive bus 17.

A portion of the current from negative bus 15 through resistor 21 is returned to ground line 14, as follows: through the reset line 20 and resistor 18 to base 13 of transistor 5 and through the inherent low resistance path in transistor 5 from the base 13 to the emitter 11 and to ground line 14. The current from the negative bus 15 is a relatively large bias current and drives the base 13 of transistor 5 sufficiently negative to bias the transistor 5 into conduction. Consequently, the transistor 5 conducts and energizes the associated lamp 8.

When the transistor 5 begins to conduct, the voltage at the collector 12 of transistor 5 decreases. The base 24 of the transistor 6 is tied to collector 12 through resistor 28 and decreases accordingly. The reduced negative or increased positive base voltage drives the transistor 6 into the non-conducting state. The collector 23 of the transistor 6 increases negatively in voltage as conduction decreases. The resistor 27 couples the increased negative voltage to the base 13 of transistor 5 to establish a higher negative bias upon the base 13 and consequently holds the transistor 5 conducting.

In the above manner, a momentary triggering reset pulse established by momentarily opening switch 19 initiates the regenerative action just described which switches transistor 6 off and the transistor 5 on to establish energization of the lamp 8 in the zero digit position.

The total resistance of resistor 16 and of the cold lamp 8 is sufficient to increase the gain of the circuit and allow regeneration which establishes conduction in the transistor 5 constituting the first stable condition of the first binary stage 1. Resistor 16 is selected with a minimum resistance to maintain the necessary conduction through transistor 5 and thereby minimizes the power losses when the particular binary stage is conducting.

A trigger bus 29 is connected to the output of the driver amplifier 4. A diode 30 connects the trigger bus 29 to the collector 23 of the control transistor 6 to direct the pulse from the amplifier 4 to the collector 23. A positive pulse from the amplifier 4 drives the collector 23 of transistor 6 positive and turns transistor 5 off.

The base 13 of the transistor 5 is connected to the collector 23 of the transistor 6 through resistor 27 and is therefore driven positive when collector 23 is driven positive. A sufficient positive bias on base 13 drives transistor 5 to stop conduction and through the regenerative coupling establishes conduction in transistor 6, as follows:

The regenerative coupling of the transistors 5 and 6 is established through the resistors 27 and 28, generally in a manner as previously described, and reverses the stable condition with the control transistor 6 conducting and the output transistor 5 cut off. Thus, as the conduction of transistor 5 decreases, the potential of collector 12 increases. The base 24 of the control transistor 6 correspondingly increases and biases the transistor 6 to conduct. Simultaneously, the collector 23 of the transistor 6 goes positive initiating conduction and as the current increases, an increasing positive voltage is fed back through the resistor 27 to the base 13 of the transistor 5 to further bias the transistor 5 to cut off. This action is regenerative and switches the conduction of the two transistors 5 and 6 as a result of the initial positive pulse applied to collector 23 of transistor 6. Therefore, the second stable condition is maintained even though the triggering pulse terminates. The lamp 8 connected in the first binary stage 1 as therefore turned off.

A capacitor 31 and a resistor 32 are connected in series between the collector 12 of the transistor 5 in the first binary stage 1 and the input of the second binary stage 2. The cutoff of the transistor 5 and the rapid negative increase in voltage of the corresponding collector 12 establishes a negative voltage transfer pulse which is transmitted to the next succeeding binary stage 2 through the capacitor 31 and the resistor 32.

Each of the illustrated binary stages 2 is similar in structure, connection and function. The binary stage 2 connected to the binary stage 1 is specifically described. Corresponding elements in the other stages 2 carry corresponding numbers to provide reference between the stages and the description given hereinafter.

The primary distinction between the binary stage 1 and binary stages 2 exists in the bias connection in stage 2 to establish output transistor 5 non-conducting and control transistor 6 conducting at the initial reset of the circuit. Corresponding elements in binary stages 1 and 2 are given corresponding numbers for purposes of simplicity and clarity of explanation.

Referring particularly to the binary stage 2 which is connected to binary stage 1, the output transistor 5 includes the base 13 which is connected to the positive bus 17 in series with the bias resistor 18 rather than to the reset line 20 as in stage 1. The base 24 of the control transistor 6 in the binary stage 2 is conversely connected to the reset line 20 through the biasing resistor 26 rather than to the positive bus 17, as in stage 1. Consequently, when reset switch 19 is momentarily opened, a portion of current from the negative bus 15 and through resistor 21 is returned to ground line 14 via the reset line 20 including the bias resistor 26 and the control transistor 6. This biases control transistor 6 in each of the binary stages 2 to conduct. The regenerative action established through resistors 27 and 28 biases the output transistors 5 in stages 2 to non-conduction.

When the reset switch 19 is actuated, the transistor 5 of the first binary stage 1 is established as the stable conducting condition and the associated lamp 8 is energized. All the other lamps 8 of the four binary stages 2 are de-energized as the output transistor 5 in each binary stage 2 is held in a non-conducting condition.

As previously described, base 13 of transistor 5 in binary stage 2 is connected to the collector 12 of the first binary stage 1 by the capacitor 31 and resistor 32 to transmit transfer pulses from stage 1 to stage 2.

A negative transfer pulse is applied to the base 13 of the transistor 5 from the preceding stage when, as previously described, a positive trigger pulse from trigger bus 29 turns the first binary stage 1 off. The transistor 5 of binary stage 2 is thereby driven to conduct and the associated collector 12 decreases. The resistor 27 couples the decreased voltage of collector 12 to the base 24 of the transistor 6 and the transistor 6 is driven into a non-conducting state. The regenerative action previously described results in the current switching from the control transistor 6 to the output transistor 5 in the binary stage 2. Consequently, the lamp 8 in the binary stage 2 is energized and the corresponding digit 2 is established in the readout 7.

The trigger pulse and the transfer pulse may be simultaneously applied to stage 2 and thus tend to establish opposite stable conditions. However, the transfer pulse determines the final state of the circuit by proper timing of the transfer pulse. The period of the transfer pulse is determined by the selection of capacitor 31 and resistor 32. The period of the transfer pulse is sufficiently long to bias stage 2 after the triggering pulse terminates and therefore determines the state of the stage 2. The same result may be obtained by employing a time delay device or line to transmit the transfer pulse.

All of the collectors 23 of the control transistors 6 in the binary stages 1 and 2 are relatively positive when the corresponding transistors 6 are conducting. The first positive trigger pulse appearing at trigger bus 29 does not therefore change the bias of collectors 23 in binary stages 2 because of the relatively positive voltage at the corresponding collectors. The transistor 6 of binary stage 1 is not conducting however and the collector 23 is at a relatively negative potential. The first positive pulse thus switches the binary stage 1 off which in turn switches the adjacent binary stage 2 on.

The next trigger pulse established on the trigger bus 29 only effects the on-binary stage 2. All of the collectors 23 in the other stages are already relatively positive and in the stable condition. The positive pulse applied to the relatively negative collector 23 of the on-binary stage 2 drives the associated collector 23 positive to turn the on-binary stage 2 off and establish a negative pulse at the collector 12 of transistor 5. This negative transfer pulse in stage 2 is fed to the next succeeding binary stage 2 and turns the latter on. Consequently, by a series of positive pulses, the binary stages 1 and 2 are successively turned on to record the number of pulses received.

As previously described, the illustrated circuit is merely for the first significant figure in the decimal system. A jumper line 33 is connected through a capacitor 34 and resistor 35 to the collector 12 of transistor 5 in the digit 8 binary stage 2 and to the base 13 of transistor 5 in binary stage 1 to couple a negative pulse at the last binary stage 2 to the first binary stage 1. A negative pulse from the last binary stage 2 turns on the first binary stage 1 to illuminate the associated zero digit lamp 8. Consequently, a zero appears in the first significant figure of the decimal readout in accordance with the fact that decimal numeral 10 has been reached.

A carry line 36 is also connected to the collector 12 of the transistor 5 in the 8 digit binary stage 2. The carry line 36 is connected to a similar circuit, not shown, which provides a reading in the next significant location in the decimal system. The second and subsequent ring are designed to count in increments of one.

Employing a series of the ring counters, one for each of the significant positions, establishes a decimal reading of the pulses received.

The operation of the illustrated embodiment of the invention is summarized as follows:

The reset switch 19 is momentarily opened to establish the transistor 5 of the first binary stage 1 conducting and to thereby illuminate the zero digit lamp 8 and establish a zero reading in the readout 7. The opening of the reset button 19 simutlaneously resets all of the binary stages 2 to energize the control transistors 6 in binary stages 2 and de-energize the corresponding lamps 8.

The generator 3 is operated to establish a train of pulses in accordance with any desired operation. The amplifier 4 establishes each pulse as a standard height pulse on trigger bus 29.

The first pulse appearing on the trigger bus 29 can only be detected by the collector 23 of the transistor 6 in the first binary stage 1. The first pulse therefore triggers binary stage 1 to establish conduction through control transistor 6 and stops conduction through the output transistor 5 and thereby de-energizes zero digit lamp 8. A negative pulse is established at the collector 12 of the transistor 5 in binary stage 1 and is fed to the succeeding binary stage 2 being the two digit binary stage 2.

Subsequent pulses applied through the trigger bus 29 cause the lamps 8 to be successively illuminated and establish direct reading of the number of pulses received and the operation being measured.

The load resistor 16 in series with each lamp 8 provides sufficient gain in the stage to allow regulation action and to establish conduction in the corresponding lamp 8. The coupling resistor 27 between the collector 23 of transistor 6 and the base 13 of transistor 5 is selected to suitably bias the transistor 5 for a relatively large current output. The large current in the load circuit provides sufficient energy to illuminate the incandescent lamp 8.

The coupling resistor 28 between the collector 12 of transistor 5 and the base 24 of transistor 6 however is selected to bias the transistor 6 for a relatively low current output. Although the resistance in the load circuit for transistor 6 is relatively high, the energy dissipated with the binary stage in the off position is relatively low because of the relatively low current.

Consequently, the total power consumed in the counter circuit is kept relatively low and the only circuit dissipating substantial power is that driving the then illuminated lamp 8. The asymmetrical circuit arrangement thus establishes the necessary power swing to turn on and maintain conduction of the lamps while at the same time holding the total power consumption to a minimum.

Although illustrated as a ring counter of five binary stages, the ring can be extended or reduced to any desired number by adding or subtracting of binary stages.

The present invention may be employed in any counting or similar operating circuit to establish a direct operation of an output device or the like. The circuit is particularly adapted for use in balancing equipment to establish a direct, legible digital readout of the amount or angle of unbalance in accordance with a train of pulses proportional to the amount and/or angle of unbalance.

Various modes of carrying out the invention are contemplated as being within the scope of the following claims particularly pointing out and distinctly claiming the subject matter which is regarded as the invention.

I claim:

1. In a transistor binary circuit providing high switching power, a first transistor having an output circuit including a load demanding a substantial current, a second transistor having an output circuit including a load demanding a relatively small current, and regenerative coupling between the output and input of opposite transistors to reverse the conductive state of the two transistors upon triggering, said coupling including first means biasing the first transistor to establish a large current to the first load and second means biasing the second transistor to establish a small current to the second load and thereby to create the necessary power swing in the circuit to supply the demand current to the first load and to maintain minimal power consumption when the first transistor is nonconducting.

2. In a transistor asymmetrical binary circuit, a first transistor having an output circuit, a high current operator connected directly in the output circuit of the first transistor, a second transistor having an output circuit, and regenerative coupling between the output and input of opposite transistors to reverse the conductive stage of the two transistors upon momentary trigger biasing and including first means to bias the first transistor to establish a large current and second means to bias the second transistor to establish a small current.

3. In a transistor binary circuit providing high switching power, a first transistor having an output circuit including an incandescent lamp demanding a substantial current, a second transistor having an output circuit including a load demanding a relatively small current, and regenerative coupling between the output and input of opposite transistors to reverse the conductive state of the two transistors upon triggering, said coupling biasing the first transistor to establish a large current and the second transistor to establish a small current to create the necessary power swing in the circuit to supply the demand current to the incandescent lamp and to maintain minimal power consumption when the first transistor is non-conducting.

4. In a reading device having a plurality of transistor asymmetrical binary circuits connected in cascade and having an input adapted to receive triggering signals, each of said binary circuits comprising a first transistor having an output circuit including a high current operator, a second transistor having an output circuit including a standby load, and regenerative coupling between the output and input of opposite transistors to reverse the conductive state of the two transistors upon triggering and including first means to bias the first transistor to establish high current to the operator and including second means to bias the second transistor to establish a small current in the standby load, the total power dissipation of the device being minimized by the low power dissipation in the standby load in each stage.

5. A circuit including a plurality of transistor binary circuits in cascade, each of said binary circuits comprising a first transistor having an output circuit, a load connected in the output circuit of the first transistor, a second transistor having an output circuit, regenerative circuit means including impedances coupling the input of each transistor to the output of the opposite transistor, a bias circuit for the first transistor including the regenerative impedance connected to its input and selected to bias the transistor to establish a large current in the output circuit of the first transistor, and a bias circuit for the second transistor including the regenerative impedance connected to its input and selected to bias the second transistor to establish a small current flow in the output circuit of the second transistor, only one stage of the plurality of stages having the first transistor conducting at any one time whereby the total power consumption of the circuit is minimized.

6. In a transistor binary circuit, a first transistor having an output circuit, a high current load series connected in the output circuit of the first transistor and having a relatively low resistance when cold and a relatively high resistance when hot, a second transistor having an output circuit, regenerative coupling between the output and input of opposite transistors to reverse the conductive state of the two transistors upon triggering and to bias the first transistor to establish a large current and the second transistor to establish a small current, and an impedance connected in series with said load and said first transistor to reduce the variation in loading of the transistor and to increase the gain of the binary circuit and allow regeneration to establish an operating current in the load.

7. In a transistor binary circuit, a first transistor having an output circuit, a high current load which varies upon energization series connected in the output circuit of the first transistor, an impedance connected in series with said load and said transistor to reduce the variation in loading of the transistor, a second transistor having an output circuit, regenerative coupling between the output and input of opposite transistors to reverse the conductive state of the two transistors upon triggering and to bias the first transistor to establish a large current and the second transistor to establish a small current whereby a relatively low power is consumed when the second transistor is conducting, and said impedance being selected to increase the gain of the binary circuit to establish an operating current to the load.

8. In a transistor binary circuit, a first transistor having an output circuit, a lamp load connected in the output circuit of the first transistor, said lamp having a relatively low resistance when cold and a relatively high resistance when hot, a resistor connected in series with said lamp and said transistor to reduce the variation in loading of the transistor, a second transistor having an output circuit, regenerative resistive impedances coupling the input of each transistor to the output of the opposite transistor, a bias circuit for the first transistor including the regenerative resistive impedance connected to its input and selected to establish a large current in the output circuit of the first transistor, and a bias circuit for the second transistor including the regenerative resistive impedance connected to its input and selected to establish a small current in the output circuit of the second transistor, said lamp load having an impedance insufficient to allow said regeneration and said first resistor being selected to increase the gain of the binary circuit and allow regeneration establishing current in the first lamp load.

9. In a transistor binary circuit for establishing an output in acordance with a digital drive, a first transistor having an output circuit, a second transistor having an output circuit, an incandescent lamp connected in series in the output circuit of the first transistor, a load resistor series connected to the output of the second transistor, a first and second regenerative resistor connected one each to the input of one transistor and to the output of the opposite transistor, the regenerative resistors being selected to bias the first transistor to establish a large current and to bias the second transistor to establish a small current, the resistance of said lamp when cold creating a gain of the binary circuit insufficient to switch the first transistor to conduction, a gain resistor connected in series with said lamp and said first transistor to reduce the variation in loading of the transistor and to increase the gain of the binary circuit and allow regeneration to switch the first transistor to conduction, a reset circuit connected between a negative and positive voltage and including a reset switch to open one side of the reset circuit, means connecting one of the transistors to the reset circuit to bias the transistor to conduct upon opening of the reset switch to establish a first stable condition, and a trigger input bus connected to one of the transistors to trigger the binary circuit and establish a second stable condition.

10. In a transistor circuit including a series of binary stages connected to a power supply and each of said binary stages including an output load demanding a large current, an output transistor having an output circuit serially including the output load and a control transistor, individual loads connected in series with each control transistor and adapted to be connected to the power supply, first regenerative resistors connected between the input of the output transistor and the output of the control transistor in each stage, said first regenerative resistor being selected to maintain a large current through the output transistor upon turning of the output transistor on, second regenerative resistors connected between the input of the control transistor and the output of the output transistor in each stage, said second regenerative resistor being selected to maintain a small current through the control transistor, the impedance of the output load being insufficient to establish a binary gain allowing regeneration to switch the output transistor to conduct, a resistor connected in circuit with the output load to increase the binary gain and allow switching of the output transistor to conduct, a pulse source connected to one of the control transistors to reverse the stable state of the then conducting binary stage and a different binary stage, and reset means connected to at least one of the transistors to establish the second stable state.

11. In a transistor circuit including a series of binary stages connected to a power supply and having an individual incandescent lamp connected in each stage to establish an output, an output transistor and a control transistor in each stage, a load resistor connected in series with the control transistor, a first regenerative resistor connected between the input of the output transistor and the output of the control transistor, said first regenerative resistor being selected to establish a large current through the output transistor upon turning of the output transistor on, a second regenerative resistor connected between the input of the control transistor and the output of the output transistor, said second regenerative resistor being selected to establish a small current through the control transistor, the impedance of each lamp being insufficient to establish a binary gain allowing switching of the output transistor to conduct, and gain resistors connected one each in series with the lamps to increase the binary gain and allow switching of the output transistor to conduct.

12. In a transistor circuit including a series of binary stages connected in a closed ring, each of said binary stages including a readout having an incandescent lamp constituting the energizing portion of the readout, an output transistor and a control transistor in each stage and each having an input base and an output collector and a common connected emitter, said lamp being connected in series with the output collector of the output transistor, a gain resistor connected in series with the output collector of the output transistor and the lamp, a load resistor connected in series with the output collector of the control transistor, a reset switch adapted to be connected to one side of a bias power supply and the base of the transistor in the binary stages to be conducting in a starting position of the binary circuit, a reset resistor adapted to be connected between the opposite side of the bias power supply and the base connected side of said reset switch, a first regenerative resistor connected between the base of the output transistor and the collector of the control transistor to hold the base potential in proportion to the collector potential, said first regenerative resistor being selected to maintain a large current through the output transistor, a second regenerative resistor connected between the base of the control transistor and the collector of the output transistor to hold the base potential in proportion to the collector potential, said second regenerative resistor being selected to establish a small current through the control transistor, the resistance of the lamp prior to energization being insufficient to establish a binary gain for switching of the output transistor to conduct, and the gain resistor being selected to increase the binary gain and allow switching of the output transistor to conduct.

References Cited by the Examiner

UNITED STATES PATENTS

| | | | |
|---|---|---|---|
| 2,778,978 | 1/57 | Drew | 307—88.5 |
| 2,809,304 | 10/57 | Dickinson | 307—88.5 |
| 2,843,320 | 7/58 | Chisholm | 235—92 |
| 2,851,220 | 9/58 | Kimes | 235—92 |
| 2,869,000 | 1/59 | Bruce | 307—88.5 |
| 2,877,357 | 3/59 | Pearsall et al. | 307—88.5 |
| 2,913,599 | 11/59 | Benton | 307—88.5 |
| 2,931,922 | 4/60 | Zubinis | 307—88.5 |
| 2,997,700 | 8/61 | Kramer | 307—88.5 |

MALCOLM A. MORRISON, *Primary Examiner.*

C. D. ANGEL, *Examiner.*